United States Patent
Stanescu et al.

(10) Patent No.: US 10,411,664 B2
(45) Date of Patent: Sep. 10, 2019

(54) CHOPPER-STABILIZED AMPLIFIER WITH ANALOG-DRIVEN LEVEL SHIFTER

(71) Applicant: SEMICONDUCTOR COMPONENTS INDUSTRIES, LLC, Phoenix, AZ (US)

(72) Inventors: Cornel D. Stanescu, Bucharest (RO); Razvan Puscasu, Targoviste (RO)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

(21) Appl. No.: 16/042,006

(22) Filed: Jul. 23, 2018

(65) Prior Publication Data

US 2019/0207573 A1 Jul. 4, 2019

Related U.S. Application Data

(60) Provisional application No. 62/611,982, filed on Dec. 29, 2017.

(51) Int. Cl.
*H03F 3/45* (2006.01)
*H03K 19/0175* (2006.01)

(52) U.S. Cl.
CPC . *H03F 3/45475* (2013.01); *H03K 19/017509* (2013.01); *H03F 2200/171* (2013.01); *H03F 2200/271* (2013.01); *H03F 2200/372* (2013.01); *H03F 2200/375* (2013.01)

(58) Field of Classification Search
CPC ........................................................ H03F 3/45
USPC ............................................................ 330/9
See application file for complete search history.

(56) References Cited

U.S. PATENT DOCUMENTS

| | | | |
|---|---|---|---|
| 4,048,574 A * | 9/1977 | Barbier | H03F 3/38 330/253 |
| 7,292,095 B2 | 11/2007 | Burt et al. | |
| 7,724,080 B2 * | 5/2010 | Luff | H03F 3/393 327/124 |
| 7,795,960 B2 * | 9/2010 | Lyden | H03F 3/387 330/9 |

(Continued)

FOREIGN PATENT DOCUMENTS

CN 106953517 A 7/2017

OTHER PUBLICATIONS

C. Stănescu, C. Dinca, D. McDonald, D. Paul, "A 24 V Chopper Offset-Stabilized Operational Amplifier with Symmetrical RC Notch Filters", Proceedings of the 40-th International Semiconductor Conference CAS'2017, Sinaia, Romania, p. 167-170 , 2017.

(Continued)

*Primary Examiner* — Henry Choe
(74) *Attorney, Agent, or Firm* — Brake Huges Bellermann LLP (57) ABSTRACT

A chopper-stabilized amplifier that includes an analog driven level shifter is disclosed. The analog driven level shifter changes the levels of a pair of complementary clock signals according to a level associated with an input signal to the chopper-stabilized amplifier. The level shifted complementary clock signals are used to control switching devices used for chopping input signals of various voltages. The chopper-stabilized amplifier also includes symmetrical passive RC notch filters having two cut-off frequencies to reduce ripple noise from the chopping.

20 Claims, 6 Drawing Sheets

(56) References Cited

U.S. PATENT DOCUMENTS

| | | | |
|---|---|---|---|
| 8,786,363 B2* | 7/2014 | Ahmad | H03F 3/387 330/69 |
| 8,791,754 B2* | 7/2014 | Lyden | H03G 3/008 330/9 |
| 9,391,571 B2* | 7/2016 | Stanescu | H03F 3/45475 |
| 9,584,011 B1 | 2/2017 | Puscasu et al. | |
| 9,595,922 B2* | 3/2017 | Maderbacher | H03F 3/387 |

OTHER PUBLICATIONS

C. Stănescu, C. Dinca, R. Iacob, A. Sevcenco, "Optimizing Frequency Compensation in Chopper Offset-Stabilized Amplifiers With Symmetrical RC Notch Filters", Proceedings of the 38-th International Semiconductor Conference CAS'2015, Sinaia, Romania, p. 167-170 , 2015.

* cited by examiner

CHOPPER-STABILIZED AMPLIFIER WITH ANALOG-DRIVEN LEVEL SHIFTER

CROSS-REFERENCE TO RELATED APPLICATION

This non-provisional application claims the benefit of U.S. provisional patent application No. 62/611,982, filed on Dec. 29, 2017, the entirety of the disclosure of which is incorporated by reference herein.

TECHNICAL FIELD

The disclosure relates, in general, to electronics, and more particularly, to semiconductors, structures thereof, and methods of forming semiconductor devices.

BACKGROUND

Chopper-stabilized amplifiers may be used in various electronic applications that require amplification with a low input offset voltage and low noise. One example of a chopper stabilized amplifier is described in U.S. Pat. No. 9,391,571, which is hereby incorporated herein by reference. Chopper stabilized amplifiers are typically configured to operate at low power supply voltages (e.g., between 1.8V and 5.5V). Certain applications (e.g., automotive, industrial, etc.), however, require higher voltage levels.

SUMMARY

In one aspect, the present disclosure describes a chopper-stabilized amplifier. The amplifier includes a first chopper circuit that chops an input signal a chopping frequency using switching devices controlled by a pair of complementary clock signals that are level shifted. An amplifier is coupled to the output of the first chopper circuit and amplifies the chopped input signal. A second chopper circuit is coupled to outputs of the first amplifier. The second chopper circuit chops the amplified and chopped input signal at the chopping frequency using switches controlled by a pair of complimentary clock signals that are not level shifted. The chopper-stabilized amplifier also includes symmetrical RC notch filters that are coupled to outputs of the second chopper circuit that filter signals from the second chopper circuit and output an output signal. The chopper stabilized amplifier also includes an analog-driven level shifter circuit that receives the input signal and, based on a voltage level of the input signal, level shifts the pair of complementary clock signals that are not level shifted to produce the pair of complementary clock signals that are level shifted.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

For simplicity and clarity of the illustration(s), elements in the figures are not necessarily to scale, some of the elements may be exaggerated for illustrative purposes, and the same reference numbers in different figures denote the same elements, unless stated otherwise.

DETAILED DESCRIPTION

Chopper stabilized amplifiers, as described herein, are configured to operate at relatively high input signal voltage levels to accommodate applications (e.g., automotive, industrial, etc.) wherein the supplied voltage levels may be higher (e.g., greater than 12 volts) than typically used (i.e., between 1.8V and 5.5 V).

Chopping the input signal may be achieved through switching. A field effect transistor (FET) can be used as an efficient pass through switching device. Typically, FETs are controlled to have a low ON resistance (Ron) and a high OFF resistance (Roff). The low Ron enables a signal to pass through the FET with little loss or other affects caused by the FET. The Ron is a function of the gate to source voltage, Vgs. Specifically, Ron has an inverse relationship to Vgs.

To control the switching for chopping, a clock signal can be applied to the gate of the FET while an input signal is applied to the source of the FET. In normal operation, the FET is turned ON when the clock signal (gate voltage) is higher than the input signal (source voltage) by an amount (Vgs) that exceeds the threshold voltage of the device. When the FET is turned ON the input signal at the source is transferred to the drain of the FET (i.e., like a single pole single throw (SPST) switch connected between the source and the drain). Accordingly, the clock signal must be adjusted to accommodate the signal level of the input signal for proper switching to occur.

Figure 1:
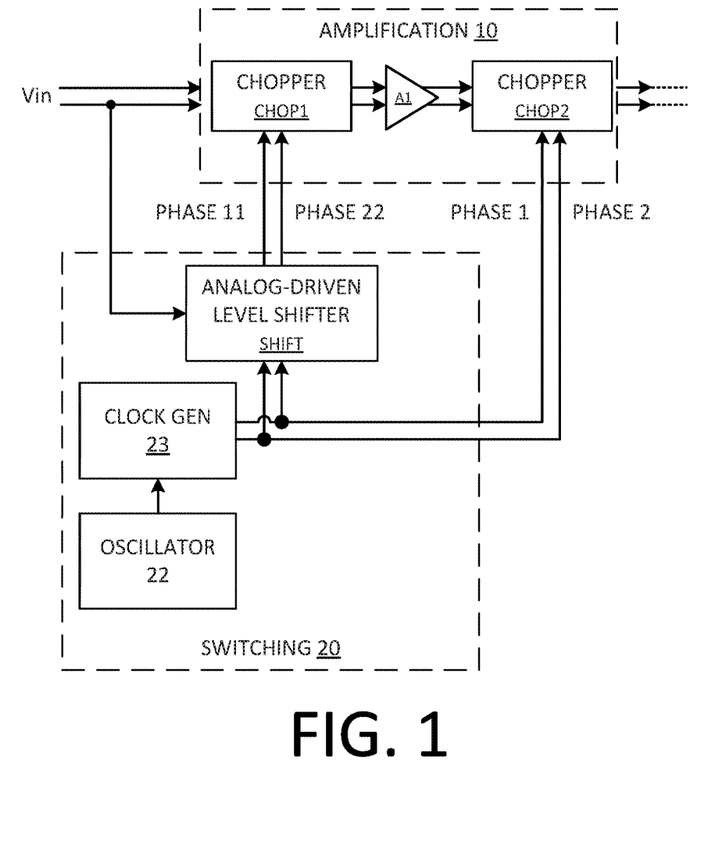
FIG. 1 is a generalized block diagram that generally illustrates portions of a chopper-stabilized amplifier according to an embodiment of the present disclosure.

FIG. 1 is a block diagram that generally illustrates portions of a chopper-stabilized amplifier according to an example embodiment. As shown, an input signal, Vin is amplified by an amplification portion 10 of the chopper stabilized amplifier. The amplification portion 10 utilizes a first chopper CHOP1 to modulate the input signal prior to amplification (i.e., by amplifier, A1) and then demodulates the amplified signal utilizing a second chopper CHOP2 so that what results is the amplified Vin input signal and on top of which the modulated noise and offset of A1 is added.

The chopping is practically achieved by switching the polarity of the input signal with respect to the polarity of the input of the amplifier A1 according to a clock frequency. The switching is achieved via a network of switch devices (e.g., N-type enhancement mode MOSFETs) in each chopper. An oscillator 22 and a clock generator 23 in a switching portion 20 of the chopper stabilized amplifier provide complementary clock signals PHASE1, PHASE2 to control the switch devices. The oscillator 22 and clock generator 23 are typically configured to provide amplitudes of clock signals, PHASE1 and PHASE2, in a voltage range between a zero volts LOW voltage and a 5 volts (or less) HIGH voltage, which is sufficient to control switching devices switching signals with comparable voltage levels.

When the input signal, Vin is a high (e.g., greater than 12 volts) voltage, however, the low voltage amplitudes of the clock signals PHASE1 and PHASE2 are insufficient to control (i.e., exceed the threshold voltage of) the switching devices (e.g., N-type MOSFETs) in the first chopper CHOP1. Accordingly, the switching portion 20 includes an analog driven level shifter SHIFT that produces complimentary clock signals PHASE11 and PHASE22. The complimentary clock signals PHASE11 and PHASE22 are in a range corresponding to the voltage range of the input signal Vin. In other words, the analog-driven level shifter provides complimentary clock signals PHASE11, PHASE2, which can switch the input signal Vin even when the input signal corresponds to high voltages. This is because the clock signals PHASE11 and PHASE22 are level shifted versions of the clock signals PHASE1 and PHASE2. The amount of level shifting is based on the input signal Vin and so provides adequate switching levels regardless of the level of Vin.

The voltage (Vin) fed to the analog-driven level shifter may be a positive or negative terminal of the Vin signal. For example, if Vin is a signal has a high terminal voltage and a low terminal voltage, then either the high or the low terminal voltage may be input to the analog driven level shifter where it can be used as a virtual ground for the level shifting process. In normal operation, the voltage difference between input 11 and input 12 is almost zero or several microvolts. That is, only one voltage level (one terminal voltage) of an input signal needs to be input to the analog-driven level shifter. It is preferable to use the non inverting input 12 to drive the level shifter, as the additional capacitance on that node will not affect functionality (e.g. phase margin for negative-feedback configuration) as it would be the case if the inverting input 11 would have been used to drive the SHIFT block.

As shown in FIG. 1, the second chopper only requires PHASE1 and PHASE2 (i.e., not level shifted) clock signals for chopping because the amplifier A1 amplifies the voltage difference at its input, thereby removing the common mode voltages that would otherwise bias the switches in CHOP2. The output of the second chopper CHOP2 is an amplified base band signal that may be fed to a filter portion (not shown) which includes one or more notch filters to remove artifacts and noise created by the chopping.

Figure 2:
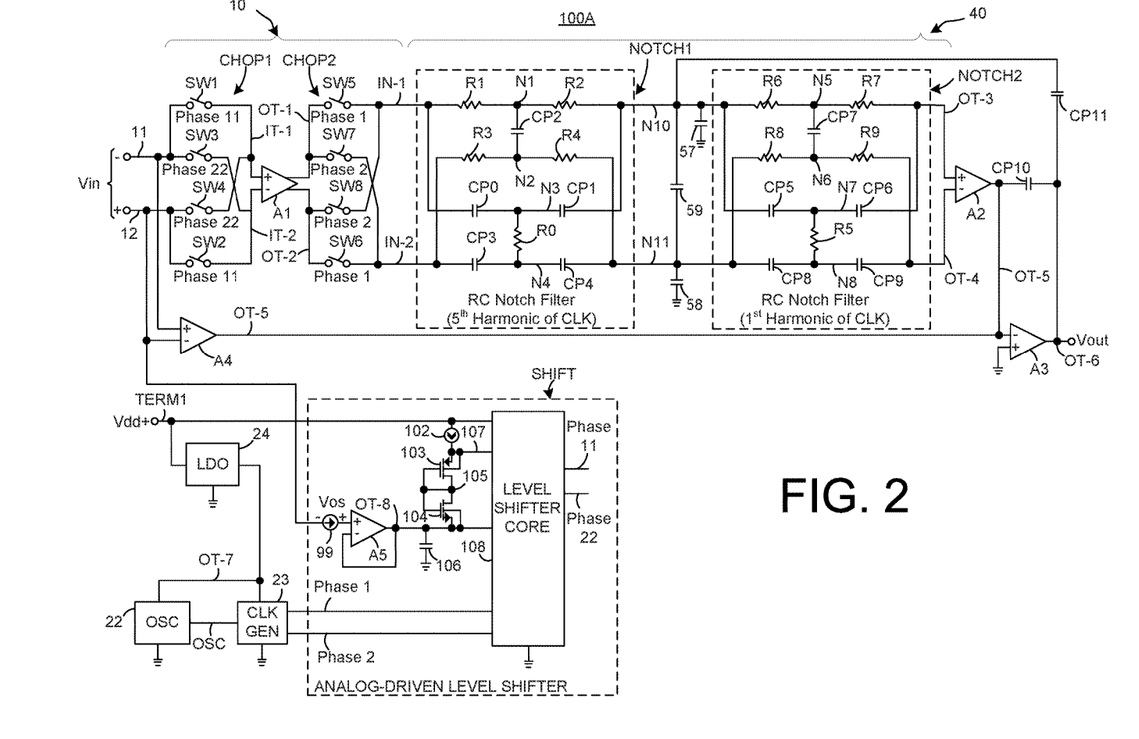
FIG. 2 schematically illustrates an example of a chopper-stabilized amplifier with an analog-driven level shifter according implementation of a high voltage chopper-stabilized amplifier using RC symmetrical notch filters and an analog-driven level shifter.

FIG. 2 schematically illustrates an example of an implementation of high voltage chopper-stabilized amplifier using RC symmetrical notch filters NOTCH1, NOTCH2 and an analog-driven level shifter SHIFT that can operate at supply voltages, Vdd, for example, between a minimum voltage of 4V and up to, for example, a voltage of 12V, 24V, 36V or 80V, depending on the fabrication process options.

In some implementations, the RC symmetrical notch filters NOTCH1 and NOTCH2 may be configured to have two cutoff frequencies. In some implementations, the first cutoff frequency may be the fifth harmonic of the chopping frequency and the second cutoff frequency may be the chopping frequency itself.

Amplifier 100A may include an input chopper circuitry or input chopper circuit, or circuit CHOP1, a first operational transconductance amplifier A1, an output chopping circuitry or output chopper circuit CHOP2, a first passive RC symmetrical notch filter NOTCH1, a second passive RC symmetrical notch filter NOTCH2, and a second operational transconductance amplifier A2. Amplifier 100A may also include a third operational transconductance amplifier A4 and a fourth operational transconductance amplifier A3.

Amplifier 100A may include an inverting input conductor or inverting input or input 11 and a non-inverting input conductor or non-inverting input or input 12 by which amplifier 100A may receive an input signal Vin. Amplifier 100A may also include an output conductor or output terminal or output OT-6. The voltage levels at inputs 11 and 12 can be between zero volts and Vdd minus 1.5 volts.

Amplifier 100A may be configured to form an output signal Vout on output OT-6. First chopper circuit CHOP1 may be configured to chop the input signal, Vin, and form a first chopped signal. Circuit CHOP1 may be also be configured to apply the first chopped signal that is derived from the input signal Vin, to first operational transconductance amplifier A1. An implementation of circuit CHOP1 may include outputs connected to respective input conductors or input terminals or inputs IT-1 and IT-2 of amplifier A1.

Amplifier A1 may also include output conductors or output terminals or outputs OT-1 and OT-2. In some implementations, output chopper CHOP2 may be configured to receive the output signal from amplifier A1. In some implementations, circuit CHOP2 may be configured to chop the output signal from amplifier A1 and produce a second chopped signal. In some implementations, chopper circuits CHOP1 and CHOP2 can be configured to reduce offset voltages in the output of the amplifier A1 and/or to reduce the common mode voltages in the output signal of amplifier A1.

An implementation of amplifier 100A may be configured to have at least two signal paths. In some implementations, a first signal path of amplifier 100A may include a three-stage high gain signal path through operational transconductance amplifiers A1, A2, and A3. In some implementations, a second signal path of amplifier 100A may include a two-stage wideband width signal path through operational transconductance amplifiers A4 and A3.

First symmetrical notch filter NOTCH1 may include a first input IN-1 and a second input IN-2 that are configured to receive the second chopped signal from circuit CHOP2. In some implementations, filter NOTCH1 may also include first and second output conductors or outputs N10 and N11, respectively. In some implementations, outputs N10 and N11 may be respectively connected to the inputs of second symmetrical notch filter NOTCH2. In some implementations, filter NOTCH2 may also include first and second output conductors or outputs OT-3 and OT-4, respectively. Outputs OT-3 and OT-4 may be respectively connected to a non-inverting input and an inverting input of amplifier A2.

An implementation of amplifier 100A may include a compensation capacitor 59 connected between outputs N10 and N11 of filter NOTCH1. In some implementations, a compensation capacitor 57 may be connected between output N10 of filter NOTCH1 and signal ground or substrate. In some implementations, a compensation capacitor 58 may be connected between output N11 of filter NOTCH1 and ground or substrate. In some implementations, capacitor 57 may have a value that may be substantially identical with the value of capacitor 58. In some implementations, the total value of capacitors 57 and CP11 may be substantially identical with the value of capacitor 58. In some implementations, a compensation capacitor CP10 may have a first terminal connected to output OT-5 of amplifier A2 and the other terminal of capacitor CP10 may be connected to output OT-6. In some implementations, a compensation capacitor CP11 may have a first terminal connected to output N10 of filter NOTCH1 and the other terminal of capacitor CP11 may be connected to output OT-6.

In some implementations, capacitor CP10 may have a value that may be substantially correlated with the value of capacitor CP11 and the ratio between the voltage gains of amplifiers A4 and A2. In some implementations, circuit CHOP1 may include switches SW1 and SW3 each having a first terminal connected to inverting input 11, and switches SW4 and SW2 each having a first terminal connected to non-inverting input 12. In some implementations, switches SW1 and SW4 may also include a second terminal connected to input IT-1 of amplifier A1, such as for example a non-inverting input, and switches SW3 and SW2 may include a second terminal connected to input IT-2 of amplifier A1, such as for example an inverting input. In some implementations, outputs OT-1 and OT-2 of amplifier A1 may be connected to inputs of output chopper circuit CHOP2. In some implementations, circuit CHOP2 may include chopper switches SW5 and SW7 each having a first terminal connected to output OT-1, and chopper switches SW8 and SW6 each having a first terminal connected to output OT-2. In some implementations, switches SW5 and SW8 may also include a second terminal connected to input IN-1, and switches SW7 and SW6 may include a second terminal connected to input IN-2.

In some implementations, one or more of the compensation capacitors, except capacitor CP10, may be relocated from outputs N10 and N11 of filter NOTCH1 to inputs IN-1 and IN-2 of same filter. For example, compensation capacitor CP11 may have the first terminal connected to input IN-1 and the other terminal may be connected to output OT-6, compensation capacitor 59 may be connected between inputs IN-1 and IN-2 of filter NOTCH1, compensation capacitor 57 may be connected between input IN-1 and a ground terminal, and compensation capacitor 58 may be connected between input IN-2 and the ground. In this implementation filter NOTCH1 may have a cut-off frequency which is substantially near the frequency or the first harmonic of clock signals used by choppers CHOP1 and CHOP2, while filter NOTCH2 may have a cut-off frequency which is substantially near the third or the fifth harmonic of the clock signals.

In some implementations, a balanced combination between the two described compensation capacitor networks may also be formed within implementations, as a trade-off for certain electrical parameters such as: settling time, transient overshoot and undershoot, rise and fall time, unity gain bandwidth, phase margin, and/or so forth.

In some implementations, the value of capacitor CP10 may have a value of approximately forty (40) picofarads, capacitor CP11 may have a value of approximately ten (10) picofarads, and capacitor 59 may have a value of approximately twenty eight (28) picofarads. In some implementations, the value of capacitor CP11 may be optimized versus CP10 for symmetrical error in processing the high-amplitude sinusoidal signal. In some implementations, capacitors 57 and 58 may each have a value of approximately eighteen (18) picofarads. In some implementations, capacitor values may be different.

An implementation of amplifier 100A may include a terminal TERM1, where the positive supply voltage Vdd is applied. In some implementations, terminal TERM1 may be used as input for a positive voltage regulator of LDO type 24. In some implementations, circuit 24 may have an output OT-7 which may be used to supply with a regulated voltage an oscillator circuit 22 and a clock generator circuit 23. In some implementations, the output of oscillator 22 is a terminal OSC used as input for circuit 23. In some implementations, circuit 23 may have one output Phase 1 and one output Phase 2, symmetrical with Phase 1 (i.e., Phase 1 and Phase 2 are complementary signals). In some implementations, phase 1 and Phase 2 may be used to drive the switches SW5 to SW8 from chopper CHOP2.

In some implementations, switches SW5 to SW8 may be implemented using low-voltage NMOS transistors or isolated low-voltage NMOS transistors.

In some implementations, amplifier 100A may include an analog-driven level shifter circuit SHIFT configured to receive the positive supply voltage (Vdd) at terminal TERM1, the input 12, and the clock phases: Phase 1 and Phase 2.

In some implementations, analog-driven level shifter circuit SHIFT may include an operational amplifier A5 which may have a built-in negative offset voltage Vos 99. Amplifier A5 may be unity-gain configured and/or may use input 12 to generate at an output OT-8 a voltage that follows the one applied on input 12. In some implementations, amplifier A5 can be used to generate a virtual ground that follows the common-mode input voltage by copying the non-inverting input voltage 12. The non-inverting input 12 is preferred because its input capacitance is less critical than the inverting input 11, which is used for negative feedback. If the inverting input 11 is used instead input 12, the additional input capacitance given by A-5 could affect the closed-loop response by reducing the phase margin.

In some implementations, amplifier A5 may have both bandwidth and slew-rate at least as high as those of circuit comprising stages A1, A4, A2, and A3. In some implementations, amplifier A5 may have a low output resistance by using a common-source output stage in order to reduce (e.g., minimize) the glitches on output voltage OT-8, which are prone to be fed, through the input capacitance of its input stage, to the input 12, and consecutively to output voltage OT-6. In some implementations, the input capacitance of op amp A5 may be low by design. In some implementations, the value of voltage Vos may be several tens of millivolts (mV). In some implementations, Vos voltage 99 and its sign may be used to produce a desirable operating point for the output stage of operational amplifier A5, i.e. a positive output voltage, if the voltage on input 12 is as low as ground voltage or zero. In other words, Vos may be set by design to give a positive voltage of tens of mV at OT-8 if the input 12 is at zero volts. This setting places amplifier A5 at a proper operating point even in a worst case scenario (i.e. all transistors within A5 are in an active region).

In some implementations, a capacitor 106 may be connected (e.g., coupled, electrically coupled or connected) between output OT-8 of amplifier A5 and ground or substrate as a bypass capacitor. In some implementations, the capacitor 106 can be selected to smooth the voltage OT-8 and/or reduce glitches fed through the entire circuit 100A to the output OT-6. In some implementations, capacitor 106 may have a value of several picofarads to smooth the voltage at output OT-8, which reduces any glitches within signals Phase 11 and Phase 22. The glitches are produced by the dynamic current consumption within the level shifter core 108 between terminal 107 and output OT-8.

In some implementations, a current generator 102 may be connected between terminal TERM1 and an output 107. In some implementations, current generator 102 may source several microamps (μA) to tens of μA.

Figure 3A:
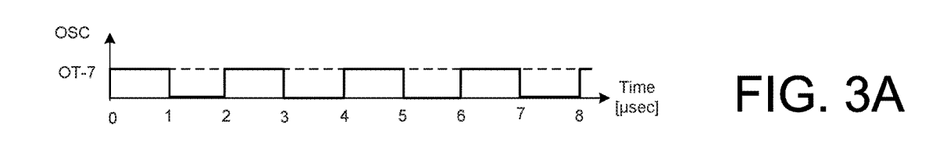
FIGS. 3A-3E are graphs illustrating signals that may be formed during the operation of the high voltage chopper-stabilized amplifier using RC symmetrical notch filters and analog-driven level shifter, in accordance with the implementation shown in FIG. 2.
Figure 3B:
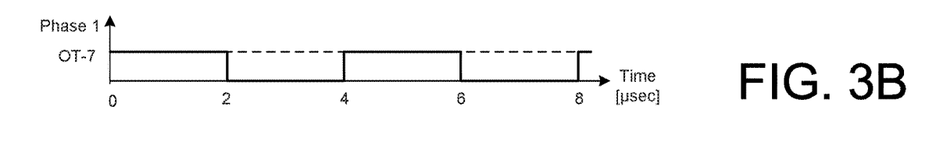
Figure 3C:
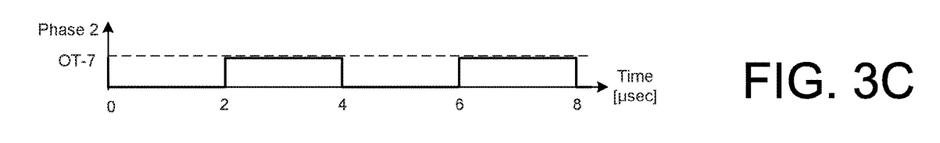
Figure 3D:
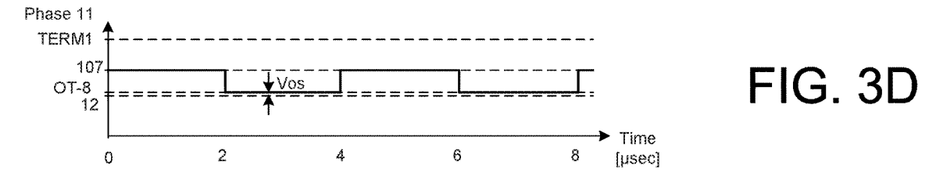
Figure 3E:
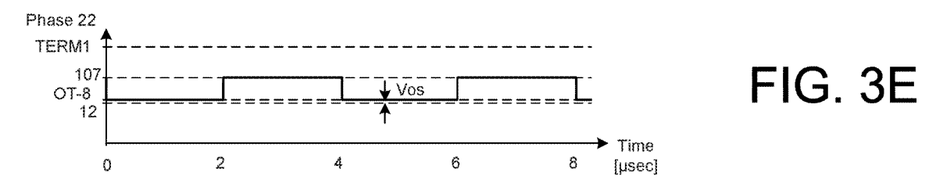

In some implementations, a PMOS transistor 103 configured as diode may be connected in series, at a terminal 105, with a NMOS transistor 104, which can also be configured as diode. The PMOS transistor 103 and the NMOS transistor 104 can be connected between terminal 107 and output OT-8. The diode-connected stack (including the PMOS transistor 103 and the NMOS transistor 104) may establish the voltage swing of Phase 11 and 22 (shown and described in more detail in FIG. 3). In some implementations, width-over-length (W/L) ratio for transistors 103 and 104 may be higher than, for example, 10 to reduce (e.g., minimize) both the voltage across them and the equivalent series resistance. In some implementations, transistors 103 and 104 may be working as a reference voltage for the core circuit 108, maintaining a quasi constant voltage across them, voltage depending upon the types of transistors 103 and 104 (e.g., low-threshold or normal threshold devices) and the operating point. It is desirable to use diode-connected PMOS and NMOS transistors to generate the voltage at terminal 107, because the digital circuitry within level shifter core 108 and choppers CHOP1 and CHOP2 use the same types of transistors. This approach guarantees a proper generation of Phase 11 and Phase 22 over process variation and temperature.

In some implementations, types of transistors 103 and 104 may be correlated with those used in chopper circuits CHOP1 and CHOP2, and input stages of amplifiers A1, A4 and A5. This correlation insures that Phase 11 and Phase 22 will always be higher than the drop across transistor 103, which is comparable with the threshold voltage of NMOS transistors used in CHOP1 and CHOP2. In other words the correlation helps guarantee that the switches SW1 to SW8 be properly switched by Phase 11 and Phase 22. In some implementations, this quasi constant voltage drop across the diode-connected transistors may be used to give the amplitude of the signals Phase 11 and Phase 22. In some implementations, this voltage may be compared with difference between supply voltage Vdd and maximum value of the common-mode voltage of circuit 100A. In some implementations, existing high voltage chopper-stabilized amplifiers do work at common-mode voltages up to Vdd minus 1.5V, meaning that if normal threshold devices are used for transistors 103 and 104, they are to be operated in the sub-threshold region to give a voltage across close but still not equal with 1.5V. In some implementations, a low-threshold PMOS device 103 and a normal threshold NMOS device 104 can be used.

In some implementations, a level shifter core circuit 108 may receive the positive supply voltage at terminal TERM1, the voltages 107 and OT-8 and the signals Phase 1 and Phase 2. The level shifter core circuit 108 generates Phases 11 and 22 by changing a zero voltage ground into a virtual ground OT-8, which has the voltage value of input 12 (plus the built-in voltage Vos 99). The amplitudes of Phase 1 and Phase 2 are shifted from the voltages between ground and OT-7 to voltages between terminal 107 and output OT-8 while the timing of Phase 11 and Phase 22 remain synchronous with Phase 1 Phase 2 respectively. In some implementations, circuit 108 may have one output Phase 11 and one output Phase 22, symmetrical with Phase 11. In some implementations, Phase 11 and Phase 22 may be used to drive in a properly manner switches SW1 to SW4 from chopper CHOP1.

In some implementations, switches SW1 to SW4 may be implemented using high-voltage NMOS transistors. In some implementations, using relative low (e.g., minimum) sized transistors for switches SW1 to SW4 may reduce the charge injection and average input bias currents at inputs 11 and 12.

FIG. 3 presents an example implementation of the digital signals used to drive chopper circuits CHOP1 and CHOP2. In some implementations, the signal generated by OSC circuit 22 on terminal OSC may have a frequency of 500 kHz or a period of 2 μs. In some implementations, the amplitude of this 50% duty-cycle signal may be regulated voltage OT-7, provided by LDO circuit 24. In some implementations, CLK GEN circuit 23 may use the signal available on terminal OSC to generate 2 symmetrical and 50% duty-cycle signals Phase 1 and Phase 2, both having a frequency of 250 kHz or a period of 4 μs.

In some implementations, the analog-driven level shifter circuit SHIFT may use signals Phase 1 and Phase 2 to generate a pair of symmetrical (i.e., complementary) and 50% duty-cycle signals Phase 11 and Phase 22. In some implementations, signals Phase 11 and Phase 22 may follow voltage at input 12 in such a way that their virtual ground is value from input 12, plus value of built-in Vos voltage 99. In some implementations, signals Phase 11 and Phase 22 are synchronized with signals Phase 1 and Phase 2, in such a way that chopper circuits CHOP1 and CHOP2 are driven in the same time. In some implementations, the amplitude of signals Phase 11 and Phase 22 is given by the voltage across the diode-connected transistors 103 and 104, or by the voltage between terminals 107 and OT-8. In some implementations, in FIG. 3, the voltage on input 12 has an in-between value. In other words, the common-mode input voltage (i.e., voltage at input 12) can be anywhere in-between zero volts and Vdd minus 1.5V. FIG. 3 illustrates the case in which input 12 has an in-between voltage.

In some implementations, circuit 100A may operate for voltages on input 12 between ground (zero or 0 V) and up to voltage on terminal TERM1 (Vdd) minus 1.5 V. In some implementations, if the voltage on input 12 is at this maximum value, the voltage at line 107 can be relatively close to voltage on terminal TERM1, Vdd. In some implementations, circuit 100 can be configured so that current source 102 has enough voltage room to properly operate. Specifically, the minimum voltage across current source 102 may be between 10 and 100 millivolts.

The operational amplifier A5 now buffers the non-inverting input voltage 12 in order to create the reference level for the control signals Phase 11 and 22.

Figure 4:
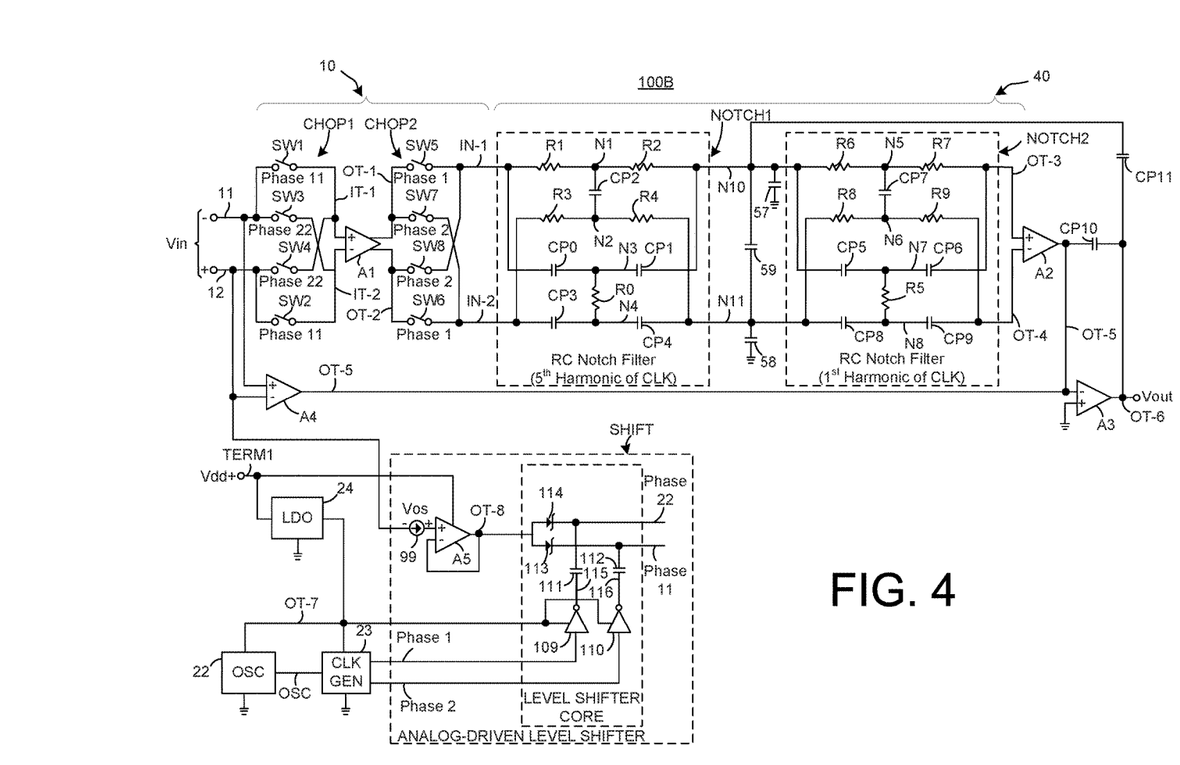
FIG. 4 schematically illustrates another example of an implementation of a high voltage chopper-stabilized amplifier using RC symmetrical notch filters and an analog-driven level shifter.
Figure 5A:
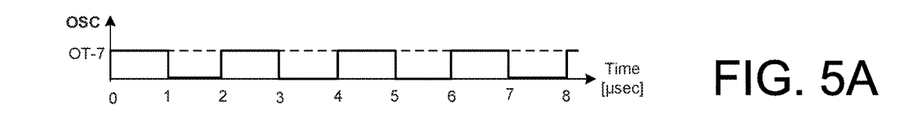
FIGS. 5A-5E are graphs illustrating signals that may be formed during the operation of the high voltage chopper-stabilized amplifier using RC symmetrical notch filters and analog-driven level shifter, in accordance with the implementation shown in FIG. 4.
Figure 5B:
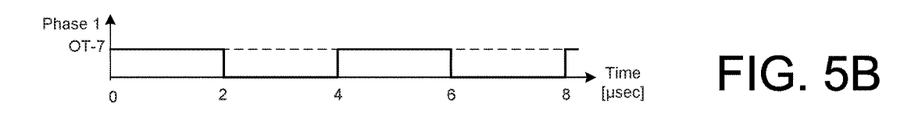
Figure 5C:
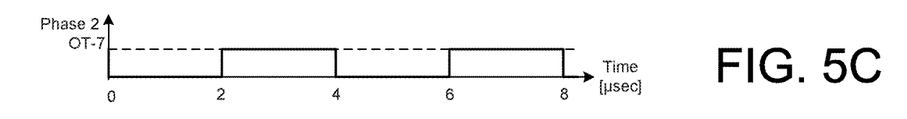
Figure 5D:
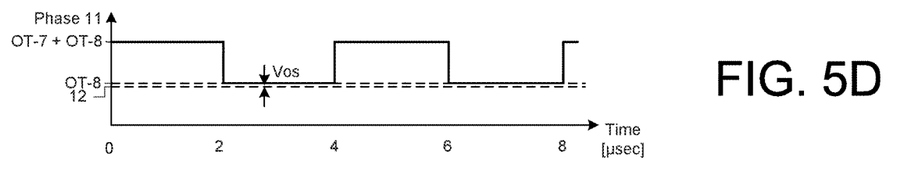
Figure 5E:
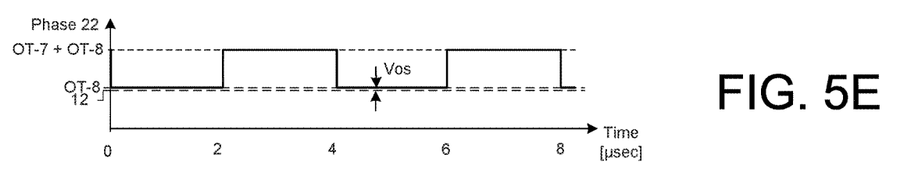

FIG. 4 schematically illustrates another implementation of high voltage chopper-stabilized amplifier using RC symmetrical notch filters, circuit 100B, in which the analog-driven level shifter SHIFT has a different implementation. The circuit 110B can be a variation of the circuit 100A. Accordingly, the description of the elements associated with circuit 100A applies to circuit 100B except for the variations.

In this implementation, elements 102 to 107 are removed and the level shifter core 108 includes the elements shown in FIG. 4. Specifically, the elements 102 to 107 devices are replaced with a capacitive level shifter core including two inverters 109,110 having as inputs the complementary clock signals from the clock generator, two capacitors 111,112 coupled to the outputs of the two inverters. The buffered output of A5 OT-8 (i.e., the input voltage level) is coupled to two diodes (e.g., Schottky diodes) 113, 114 and is capacitively coupled by the two capacitors 111, 112 to the output of the two inverters 109, 110 (i.e., the Phase 1 and Phase 2 signals).

The operational amplifier A5 buffers the non-inverting input voltage 12 in order to create the reference level for the control signals, Phase 11 and Phase 22. In this implementation, the offset voltage Vos 99 may not have much influence (e.g., any influence) on the performance of the system since offset voltage Vos 99 is much smaller compared to the amplitudes of both the control signals, Phase 11 and Phase 22. In this implementation, the overall generation of Phase 11 and Phase 22 can be simplified, compared with the previous described configuration.

FIG. 5 presents another implementation of the digital signals used to drive chopper circuits CHOP1 and CHOP2. Specifically, FIG. 5 depicts the Phase 1/Phase 2 and Phase 11/Phase 22 operations according to the implementation illustrated in FIG. 4. In this case, the amplitudes of Phase 11 and Phase 22 signals are equal to the amplitudes of Phase 1 and Phase 2 signals. The Vos value (99) may not affect in any way the circuit operation since it is much smaller compared to the amplitudes of both the control signals, Phase 11 and Phase 22. In this implementation, analog-driven level shifter circuit SHIFT may use signals Phase 1 and Phase 2 to generate 2 symmetrical and 50% duty-cycle signals Phase 11 and Phase 22. In some implementations, signals Phase 11 and Phase 22 may follow voltage at input 12 in such a way that their virtual ground is value from input 12, plus the value of built-in Vos voltage 99. In some implementations, signals Phase 11 and Phase 22 are synchronized with signals Phase 1 and Phase 2, in such a way that chopper circuits CHOP1 and CHOP2 are driven in the same time. In some implementations, the amplitude of Phase 11 and Phase 22 signals is equal to the amplitudes of Phase 1/2 signals.

Figure 6:
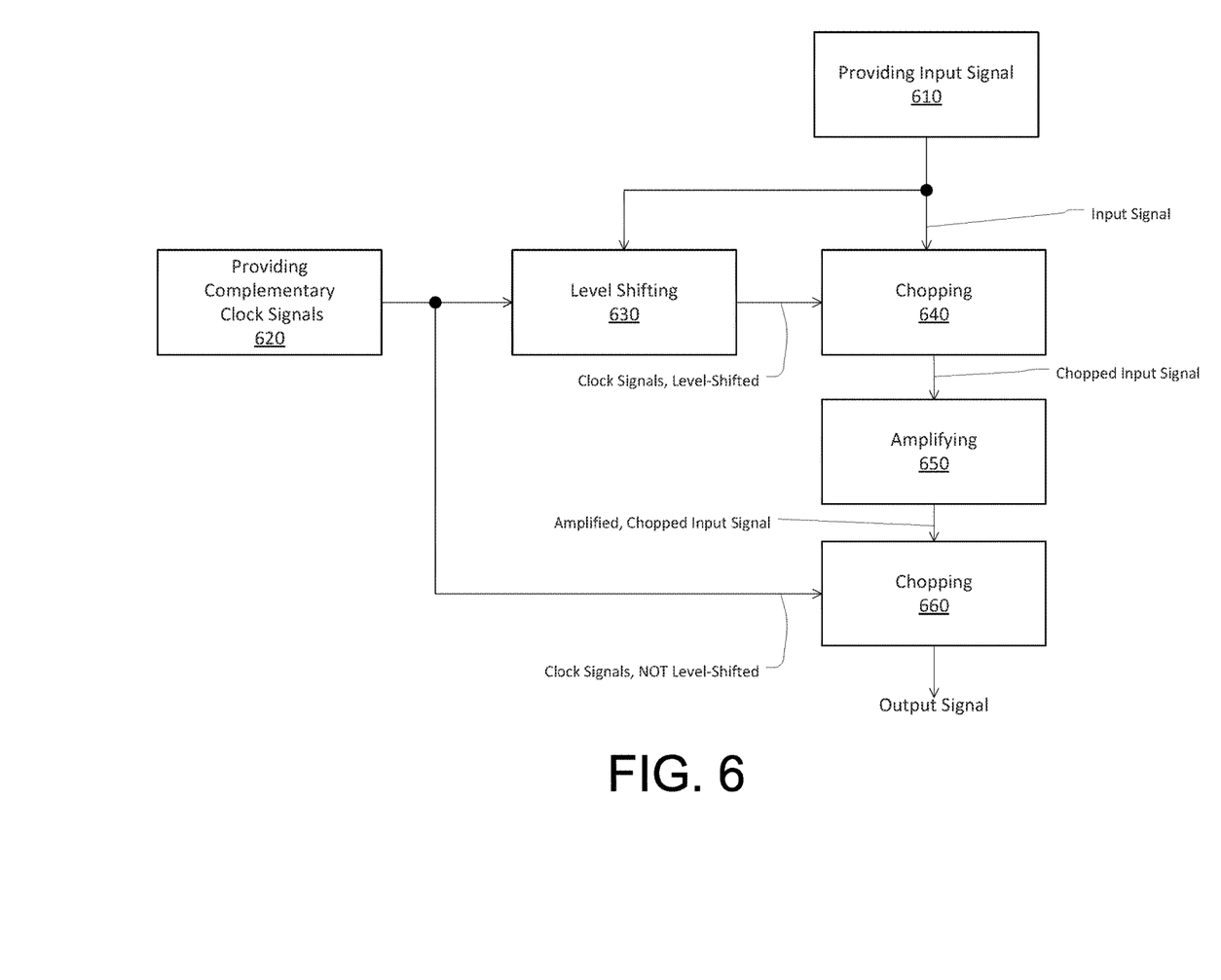
FIG. 6 is a flow chart depicting a method for amplifying a signal according to an embodiment of the present disclosure.

FIG. 6 is a flow chart depicting a method for amplifying a signal. In this method, an input signal that has a voltage level that is greater than a pair of complementary clock signals is provided 610. The input signal is chopped 640 by switching its polarity using switching devices of a first chopping circuit. The switching devices in the first chopping circuit are controlled by a pair of complementary clock signals that are provided 620 and level shifted 630. The chopped input signal is then amplified 650 and chopped again 660 by switching its polarity using switching devices of a second chopping circuit. The switching devices of the second chopping circuit are controlled by the provided 620 complementary clock signals are not level shifted.

In some implementations, the use of symmetrical passive notch filters as NOTCH1 and NOTCH2 may reduce the aliasing between the input signal Vin and the chopping Phases 1-2 and 11-22 in such a way that this phenomenon occurs at higher frequencies and it is less critical if compared with implementations using switched-capacitor notch filters.

A portion 10 of the chopper-stabilized amplifiers (e.g., circuits 100A, 100B described herein) is described in more detail below. The chopper-stabilized amplifiers can have reduced number of glitches and/or amplitude of glitches in the output signal.

In some implementations, the output of circuit CHOP2 is applied to differential inputs IN-1 and IN-2. Although not shown, an implementation may include that input IN-2 may be connected to one terminal of a compensation capacitor, the other terminal of which may be connected to ground. Input IN-1 may be connected to one terminal of a compensation capacitor, the other terminal of which may be connected to ground.

In an implementation, filters 40 (including symmetrical notch filters NOTCH1, NOTCH2) may be configured to be symmetrical including symmetrical to a virtual ground. For example, section NOTCH1 may be symmetrical around a virtual ground such that the two signal paths connected to input IN-1 and connected between input IN-1 and the virtual ground, and such that the two signal paths connected to input IN-2 are connected between input IN-2 and the virtual ground. In an implementation, filters 40 may be symmetrical by being configured to receive a differential input signal from the two outputs of circuit CHOP2 and configured to provide a differential output signal between outputs OT-3 and OT-4.

In some implementations there may be a short dead time between the asserted states of Phase 1 and Phase 2 to ensure that there is no overlap of the asserted states of the Phase 1 and Phase 2 signals. The Phase 1 and Phase 2 clock signals may be referenced to or derived from the master clock signal from oscillator 22 formed with portion 10 on a common semiconductor substrate.

In some implementations, filters 40 may be formed to include a frequency response that includes a plurality of notches or cutoff frequencies. In one implementation, filters 40 may be configured to form the notches approximately at harmonics of the chopping frequency (fs) of circuits CHOP1 and CHOP2, so that the notches may assist in suppressing the ripple voltages that can occur in a chopper-stabilized amplifier. In some implementations, the chopping frequency may be the frequency of either of clock signals Phase 1 or Phase 2. In some implementations, the amplitude of the ripple voltage as it appears at the input of filters 40, such as for example, a triangle voltage waveform may be related to the value of capacitor 59 and also to the chopping frequency fs. In some implementations, filters 40 may be configured to include at least two-cutoff frequencies. An implementation of filters 40 may be configured to filter not only the first harmonic or fundamental of the chopping frequency (fs) used to operate circuit CHOP2 (or alternately the frequency fs used to operate circuits CHOP1 and/or CHOP2), but also at least one other harmonic of the chopping frequency used to operate circuit CHOP2. In some implementations, the other harmonic may be the third harmonic. Some implementation may include configuring filters 40 as a symmetrical passive RC notch filter. Some implementation may include configuring filters 40 with only passive components, such as for example with only resistors and capacitors. In some implementations, filters 40 may be configured to operate without receiving a two phase clock signal. Some implementations of filters 40 may be configured to be devoid of clock signals used to operate any of the elements of filters 40. In an implementation, portion 10 may be configured to operate with only a single two phase clock, such as for example a single two phase clock that is derived from a master clock. An implementation may include that the chopping frequency may be correlated with the cut-off frequencies of filters 40 by forming the clock generation circuit that includes oscillator 22 and circuit 23 to include a current-driven oscillator and a bias circuit that are formed to use the same type of resistor as the resistors in filters 40. Filters 40 can improve the stability of the output signal Vout formed on output OT-6 and reduces output glitches in the output signal Vout.

Filters 40 may also be configured to include multiple signal paths in an implementation. An implementation of filters 40 may be configured to include two sections, a first section NOTCH1 and a second section NOTCH2. Additionally, first section NOTCH1 may be configured to include multiple signal paths in some implementations. For example, each input IN-1 or IN-2 may be connected to a first signal path made with resistors and to a second signal path made with capacitors. In some implementations, input IN-1 may be connected to one signal path that includes series connected resistors R1 and R2, and to another signal path that includes series connected capacitors CP0 and CP1. Both of these signal paths may be reconnected together at a node N10. In some implementations, node N10 may be configured as a first output or output of first section NOTCH1. Similarly, input IN-2 may be connected to a first signal path that includes series connected resistors R3 and R4, and to a second signal path that includes series connected capacitors CP3 and CP4. Both of these signal paths may be reconnected together at a node N11. In some implementations, node N11 may be configured as a second output or output of first section NOTCH1. Thus, section NOTCH1 of filters 40 may have two resistor signal paths and two capacitor signal paths coming from inputs IN-1 and IN-2. In some implementations, intermediate connections of the two resistor paths, such as for example at nodes N1 and N2, may be connected to a capacitor CP2, while intermediate connections of the two capacitor paths, such as for example nodes N3 and N4, may be connected to a resistor R0. In some implementations, the value of resistors R0-R2 and R3-R4 may be identical. Also, some implementation may include that the value of capacitors CP0-CP1, CP2, and CP3-CP4 may be identical. This may assist in providing good matching.

Some implementations of filters 40 may also include that second section NOTCH2 may also be configured to include multiple signal paths. An implementation of second section NOTCH2 may be obtained by multiplying first section NOTCH1, connecting it in series, and changing only the values of the resistors.

Some implementations of second section NOTCH2 may include two resistor signal paths and two capacitor signal paths connected to the two inputs of section NOTCH2. In some implementations, the two inputs of section NOTCH2 may be connected to respective outputs N10 and N11 of section NOTCH1. In some implementations, second section NOTCH2 may include a first signal path and a second signal path connected to a first input of section NOTCH2, for example, such as to output N10 of first section NOTCH1. In some implementations, the first signal path may include series connected resistors R6 and R7 and the second signal path may include series connected capacitors CP5 and CP6. In some implementations, both of these signal paths may be reconnected together at output OT-3. In some implementations, output OT-3 may be configured as a first output of second section NOTCH2. Also, some implementations of the second input to section NOTCH2 may be connected both to a first signal path made with series connected resistors R8 and R9, and to a second signal path made with series connected capacitors CP8 and CP9. Both of these two signal paths from output N11 may be reconnected together at output OT-4. In some implementations, output OT-4 may be configured as a second output of second section NOTCH2. In some implementations, the intermediate connections of the two resistors paths of section NOTCH2, such as for example nodes N5 and N6, may be connected to a capacitor CP7, while the intermediate connections of the capacitor paths, such as for example nodes N7 and N8, may be connected to a resistor R5.

In some implementations, the value of resistors R5-R7 and R8-R9 may be substantially equal. In some implementations, also, the value of capacitors CP5-CP6, CP7, and CP8-CP9 may be substantially equal, and in some implementations may also be substantially equal to the value of capacitors CP0-CP1, CP2, and CP3-CP4.

In some implementations, portion 10 may also include a feed-forward path that includes amplifier A4 and amplifier A3. In some implementations, amplifier A3 may be configured as an operation amplifier. Input 12 of portion 10 may be connected to an inverting input of amplifier A4, and a non-inverting input of amplifier A4 may be connected to input 11 of portion 10. In some implementations, an output OT-5 of amplifier A4 may be commonly connected to an inverting input of amplifier A3, to an output of amplifier A2, and to a first terminal of compensation capacitor CP10, the other terminal of which may be connected to output OT-6. In some implementations, a non-inverting input of amplifier A3 may be connected to ground. In some implementations, an output of amplifier A3 may be connected to output OT-6. In some implementations, the transconductance of amplifiers A1 and A2 are gm1 and gm2, respectively. In some implementations, the transconductance of amplifiers A3 and A4 are gm3 and gm4, respectively.

As expressed hereinbefore, an implementation of filters 40 may be configured to have two cutoff frequencies. In some implementations, the first cutoff frequency may be the chopping frequency used to operate circuit CHOP2 (or alternately the frequency used to operate circuit CHOP1) and the second cutoff frequency may be a harmonic of the chopping frequency. In some implementations, the second cutoff frequency may be the third harmonic of the chopping frequency. For example, some implementations of filters 40 may be configured to filter not only the first harmonic of the chopping frequency used to operate circuit CHOP2 (or alternately the frequency used to operate circuit CHOP1), such as for example the frequency of signals Phase 1 and Phase 2, but also at least one other harmonic of the chopping frequency used to operate circuit CHOP2. In some implementations, the second cutoff frequency of filters 40 may be formed to be other harmonics other than the third harmonic. In some implementations, the second notch frequency may be other odd harmonics since the odd harmonics are believed to carry most of the energy, apart from the even harmonics. For example, the second notch frequency may be a fifth harmonic.

In some implementations, the values of the resistors and capacitors in first section NOTCH1 may be selected to form the second cutoff frequency, and the values of the resistors and capacitors of second section NOTCH2 of filters 40 may be chosen for form the first cutoff frequency.

In a non-limiting example implementation of filters 40, the magnitude of differential transfer function of filters 40 may increase at high frequencies to a value near to substantially 0 dB or 1.

Forming filters 40 with two cutoff frequencies or notches may introduce certain series resistances between outputs IN-1 and IN-2 of chopping circuit CHOP2 and outputs OT-3 and OT-4 of filters 40. However, the noise generated by these series resistances is divided, from the overall input-referred noise point of view, by the voltage gain of amplifier A1 which means that any noise degradation brought by filters 40 with two cutoff frequencies is quite low.

From all the foregoing, one skilled in the art can determine that it is desirable to form a chopper-stabilized amplifier having reduced output ripple noise and a reduced offset voltage such as for example by using a novel filtering of the signal generated at the output of the chopper amplifier. Some implementations may include forming a passive symmetrical notch filter.

In some implementations, multi-phase clock signals may be used that have only two substantially symmetrical clock signals. In some implementations, no clock signals may be used within the filter section of the symmetrical notch filter. It is believed that the number of glitches within the output signal is reduced. Some implementations may include the use of a symmetrical passive PC (Resistor-Capacitor) notch filter with two-cutoff frequencies.

In at least one general aspect, a high voltage chopper-stabilized amplifier using RC symmetrical notch filters and analog-driven level shifter can include a first operational transconductance amplifier, a first chopper circuit coupled to an input of the first operational transconductance amplifier for chopping an input signal and applying a chopped input signal to the input of the first operational transconductance amplifier, and a second chopper circuit coupled to an output of the first operational transconductance amplifier for chopping an output signal produced by the first operational transconductance amplifier. The chopper-stabilized amplifier can include a symmetrical passive RC notch filter with two cutoff frequencies having an input coupled to an output of the second chopper circuit to filter a chopped output signal produced by the second chopper circuit to notch filter ripple voltages received from the output of the second chopper circuit.

The symmetrical passive RC notch filter can include first and second inputs, the symmetrical passive RC notch filter can include first and second outputs, and the symmetrical passive RC notch filter can include two cascaded sections, one for each cutoff frequency. The symmetrical passive RC notch filter section can include a first path including a first resistor coupled between the first input and a first node, and a second resistor coupled between the first node and a second node. The symmetrical passive RC notch filter can include a second path including a first capacitor coupled between the first input and a third node, and a second capacitor coupled between the third node and the second node. The symmetrical passive RC notch filter can include a third path including a third resistor coupled between the second input and a fourth node, and a fourth resistor coupled between the fourth node and a fifth node. The symmetrical passive RC notch filter can include a fourth path including a third capacitor coupled between the second input and a sixth node, and a fourth capacitor coupled between the sixth node and the fifth node, and a fifth resistor coupled between the third node and the sixth node and a fifth capacitor coupled between the first node and the fourth node/The symmetrical passive RC notch filter can include a fifth path including a sixth resistor coupled between the second node and a seventh node, and a seventh resistor coupled between the seventh node and the first output. The symmetrical passive RC notch filter can include a sixth path including a sixth capacitor coupled between the second node and an eighth node, and a seventh capacitor coupled between the eighth node and the first output. The symmetrical passive RC notch filter can include a seventh path including an eighth resistor coupled between the fifth node and a ninth node, and a ninth resistor coupled between the ninth node and the second output. The symmetrical passive RC notch filter can include an eighth path including an eighth capacitor coupled between the fifth node and a tenth node, and a ninth capacitor coupled between the tenth node and the second output. The symmetrical passive RC notch filter can include a tenth capacitor coupled between the seventh node and the ninth node and a tenth resistor coupled between the eighth node and the tenth node.

The chopper-stabilized amplifier can include a low dropout voltage regulator connected to a positive supply rail to generate a low voltage referred to ground, and an oscillator supplied by the low dropout regulator to generate a stable high frequency clock signal. The chopper-stabilized amplifier can include a clock generator supplied from the low dropout voltage regulator to generate two complementary clock signals having half of the frequency of the signal generated by the oscillator. The chopper-stabilized amplifier can include an analog-driven level shifter circuit used to generate the clock phases needed by the first chopper circuit.

The analog-driven level-shifter circuit can include an operational amplifier having a built-in negative offset voltage and working as voltage follower for the non-inverting input of the high voltage chopper-stabilized amplifier to generate a virtual ground inner signal. The analog-driven level-shifter circuit can include a current generator taking current from the positive supply rail. The analog-driven level-shifter circuit can include a stack of diode-connected isolated transistors, PMOS and NMOS, connected between the current generator and the output of the voltage follower. The analog-driven level-shifter circuit can include a bypass capacitor connected between the output of the voltage follower and ground. The analog-driven level-shifter circuit can include a core of the level-shifter which uses the voltage across the stack of diode-connected PMOS and NMOS transistors and the complementary clock signals from the clock generator to generate another pair of complementary clock signals used to drive the first chopper circuit. The chopper-stabilized amplifier can include any combination of the following elements.

In some implementations, the two cutoff frequencies of the symmetrical passive RC notch filter are correlated to approximately a fifth harmonic of the chopping frequency and approximately the chopping frequency.

In some implementations, the chopper-stabilized amplifier can include configuring the chopper-stabilized amplifier to use two pairs of complementary clock signals, both having substantially fifty percent duty cycles and having substantially simultaneous and opposite transitions where the first chopper circuit is configured to operate with the first pair of complementary clock signals which are following the level of the input common-mode voltage and where the second chopper circuit is configured to operate with the second pair of complementary clock signals which are related to the ground voltage.

In some implementations, the chopper-stabilized amplifier further includes a second operational transconductance amplifier having an input coupled to an output of the symmetrical passive RC notch filter, a third operational transconductance amplifier having an input coupled to an output of the second operational transconductance amplifier, and a fourth operational transconductance amplifier having an input coupled to receive the input signal and an output coupled to the output of the second operational transconductance amplifier.

In some implementations, the chopper-stabilized amplifier further includes a first compensation capacitor coupled between the second node of the symmetrical passive RC notch filter and an output of the chopper stabilized amplifier; a second compensation capacitor coupled between the input and an output of the third operational transconductance amplifier; and a third compensation capacitor coupled between the second node and the fifth node of the symmetrical passive RC notch filter.

In some implementations, the chopper-stabilized amplifier further includes a fourth compensation capacitor coupled between the second node of the symmetrical passive RC notch filter and a ground node and a fifth compensation capacitor coupled between the fifth node of the symmetrical passive RC notch filter and the ground node.

In another general aspect, a method of forming a high voltage chopper-stabilized amplifier using RC symmetrical notch filters and analog-driven level shifter includes configuring the chopper-stabilized amplifier to chop a signal at a first frequency to produce a chopped signal, and configuring a symmetrical passive RC notch filter to have at least two cutoff frequencies including a first cutoff frequency and a second cutoff frequency where the first cutoff frequency is a harmonic of the first frequency and the second cutoff frequency is substantially near the first frequency. The method can include configuring an analog-driven level shifter to follow the voltage level of the non-inverting input of the high voltage chopper-stabilized amplifier including an unity-gain configured operational amplifier having a built-in negative offset voltage, a capacitor, a stack of diode-connected NMOS and PMOS transistors, a current generator and a core of the level shifter. The method can include any combination of the following elements.

In some implementations, the method can include forming the first cutoff frequency to be a fifths harmonic of the first frequency. In some implementations, the method can include forming the first cutoff frequency to be a third harmonic of the first frequency.

In yet another general aspect, a high voltage chopper-stabilized amplifier can include RC symmetrical notch filters and analog-driven level shifter comprising. The chopper-stabilized amplifier can include a first operational transconductance amplifier, a first chopper circuit coupled to an input of the first operational transconductance amplifier for chopping an input signal and applying a chopped input signal to the input of the first operational transconductance amplifier. The chopper-stabilized amplifier can include a second chopper circuit coupled to an output of the first operational transconductance amplifier for chopping an output signal produced by the first operational transconductance amplifier. The chopper-stabilized amplifier can include a symmetrical passive RC notch filter with two cutoff frequencies having an input coupled to an output of the second chopper circuit to filter a chopped output signal produced by the second chopper circuit to notch filter ripple voltages received from the output of the second chopper circuit.

The symmetrical passive RC notch filter can include first and second inputs. The symmetrical passive RC notch filter can include first and second outputs. The symmetrical passive RC notch filter can include two cascaded sections, one for each cutoff frequency.

The symmetrical passive RC notch filter section can include a first path including a first resistor coupled between the first input and a first node, and a second resistor coupled between the first node and a second node. A second path is including a first capacitor coupled between the first input and a third node, and a second capacitor coupled between the third node and the second node. The symmetrical passive RC notch filter section can include a third path including a third resistor coupled between the second input and a fourth node, and a fourth resistor coupled between the fourth node and a fifth node. The symmetrical passive RC notch filter section can include a fourth path including a third capacitor coupled between the second input and a sixth node, and a fourth capacitor coupled between the sixth node and the fifth node. The symmetrical passive RC notch filter section can include a fifth resistor coupled between the third node and the sixth node and a fifth capacitor coupled between the first node and the fourth node. The symmetrical passive RC notch filter section can include a fifth path including a sixth resistor coupled between the second node and a seventh node, and a seventh resistor coupled between the seventh node and the first output. The symmetrical passive RC notch filter section can include a sixth path including a sixth capacitor coupled between the second node and an eighth node, and a seventh capacitor coupled between the eighth node and the first output. The symmetrical passive RC notch filter section can include a seventh path including an eighth resistor coupled between the fifth node and a ninth node, and a ninth resistor coupled between the ninth node and the second output. The symmetrical passive RC notch filter section can include an eighth path including an eighth capacitor coupled between the fifth node and a tenth node, and a ninth capacitor coupled between the tenth node and the second output. The symmetrical passive RC notch filter section can include a tenth capacitor coupled between the seventh node and the ninth node and a tenth resistor coupled between the eighth node and the tenth node.

The chopper-stabilized amplifier can include a low dropout voltage regulator connected to a positive supply rail to generate a low voltage referred to ground. The chopper-stabilized amplifier can include an oscillator supplied by the low dropout regulator to generate a stable high frequency clock signal. The chopper-stabilized amplifier can include a clock generator supplied from the low dropout voltage regulator to generate two complementary clock signals having half of the frequency of the signal generated by the oscillator. The chopper-stabilized amplifier can include an analog-driven level shifter circuit used to generate the clock phases needed by the first chopper circuit.

The analog-driven level-shifter circuit can include an operational amplifier having a built-in negative offset voltage and working as voltage follower for the non-inverting input of the high voltage chopper-stabilized amplifier to generate a virtual ground inner signal. The analog-driven level-shifter circuit can include a capacitive level shifter core comprising of two inverters, two capacitors and two charge restoring diodes having as inputs the complementary clock signals from the clock generator and generating another pair of complementary clock signals, used to drive the first chopper circuit. The chopper-stabilized amplifier can include any combination of the following elements.

In some implementations, the two cutoff frequencies of the symmetrical passive RC notch filter are correlated to approximately a fifth harmonic of the chopping frequency and approximately the chopping frequency.

In some implementations, the chopper-stabilized amplifier can include configuring the chopper-stabilized amplifier to use two pairs of complementary clock signals, both having substantially fifty percent duty cycles and having substantially simultaneous and opposite transitions where the first chopper circuit can be configured to operate with the first pair of complementary clock signals which are following the level of the input common-mode voltage. The second chopper circuit can be configured to operate with the second pair of complementary clock signals which are related to the ground voltage.

In some implementations, the chopper-stabilized amplifier can include a second operational transconductance amplifier having an input coupled to an output of the symmetrical passive RC notch filter, a third operational transconductance amplifier having an input coupled to an output of the second operational transconductance amplifier, and a fourth operational transconductance amplifier having an input coupled to receive the input signal and an output coupled to the output of the second operational transconductance amplifier.

In some implementations, the chopper-stabilized amplifier can include a first compensation capacitor coupled between the second node of the symmetrical passive RC notch filter and an output of the chopper stabilized amplifier; a second compensation capacitor coupled between the input and an output of the third operational transconductance amplifier; and a third compensation capacitor coupled between the second node and the fifth node of the symmetrical passive RC notch filter.

In some implementations, the chopper-stabilized amplifier can include a forth compensation capacitor coupled between the second node of the symmetrical passive RC notch filter and a ground node, and a fifth compensation capacitor coupled between the fifth node of the symmetrical passive RC notch filter and the ground node.

In yet another general aspect, a method of forming a high voltage chopper-stabilized amplifier using RC symmetrical notch filters and analog-driven level shifter can include configuring the chopper-stabilized amplifier to chop a signal at a first frequency to produce a chopped signal, and configuring a symmetrical passive RC notch filter to have at least two cutoff frequencies including a first cutoff frequency and a second cutoff frequency where the first cutoff frequency is a harmonic of the first frequency and the second cutoff frequency can be substantially near the first frequency. The method can include configuring an analog-driven level shifter to follow the voltage level of the non-inverting input of the high voltage chopper-stabilized amplifier including a unity-gain configured operational amplifier having a built-in negative offset voltage, two inverters, two capacitors and two charge restoring diodes. The method can include any combination of the following elements.

In some implementations, the method can include forming the first cutoff frequency to be a fifths harmonic of the first frequency. In some implementations, the method can include forming the first cutoff frequency to be a third harmonic of the first frequency.

It will be understood that, in the foregoing description, when an element, such as a region or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures. As used in this specification, a singular form may, unless definitely indicating a particular case in terms of the context, include a plural form.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A chopper-stabilized amplifier comprising:
a first chopper circuit that chops an input signal at a chopping frequency using at least one switching device controlled by a pair of complementary clock signals that are level shifted;
an amplifier coupled to an output of the first chopper circuit that amplifies the chopped input signal;
a second chopper circuit coupled to an output of the amplifier that chops the amplified and chopped input signal at the chopping frequency using at least one switching device controlled by a pair of complementary clock signals that are not level shifted;
symmetrical RC notch filters coupled to an output of the second chopper circuit that filter signals from the second chopper circuit and output an output signal; and
an analog-driven level shifter circuit that receives the input signal and, based on a voltage level of the input signal, level shifts the pair of complementary clock signals that are not level shifted to produce the pair of complementary clock signals that are level shifted.

2. The chopper-stabilized amplifier according to claim 1, wherein the amplifier is an operational transconductance amplifier.

3. The chopper-stabilized amplifier according to claim 1, wherein the symmetrical RC notch filters include a first notch filter that has a cutoff frequency at a third harmonic of the chopping frequency or at a fifth harmonic of the chopping frequency and a second notch filter that has a cutoff frequency at a first harmonic of the chopping frequency.

4. The chopper stabilized amplifier according to claim 1, wherein the analog-driven level shifter operates at supply voltages between a lower voltage of 4 volts and an upper voltage of greater than or equal to 12 volts.

5. The chopper stabilized amplifier according to claim 1, wherein the analog-driven level shifter includes an operational amplifier having a built in offset and configured as a voltage follower, the operational amplifier receiving the input signal and outputting a virtual ground for the pair of complementary clock signals that are level shifted.

6. The chopper stabilized amplifier according to claim 5, wherein the analog-driven level shifter comprises a stack of diode-connected transistors connected between a positive supply voltage of the analog-driven level shifter and an output of the operational amplifier to set an amplitude of the pair of complementary clock signals that are level shifted, the amplitude above the virtual ground.

7. The chopper stabilized amplifier according to claim 5, wherein the analog-driven level shifter comprises at least one capacitor that capacitively couples the pair of complementary clock signals that are not level shifted to the output of the operational amplifier to produce the pair of complementary clock signals that are level shifted.

8. A system comprising:
an analog-driven level shifter circuit that receives an input signal and, based on a voltage level of the input signal, level shifts a pair of complementary clock signals;
a first chopper circuit that chops the input signal at a chopping frequency using at least one switching device controlled by the level shifted pair of complementary clock signals;
an amplifier coupled to an output of the first chopper circuit that amplifies the chopped input signal; and
a second chopper circuit coupled to an output of the amplifier that chops the amplified chopped input signal at the chopping frequency using at least one switching device controlled by the pair of complementary clock signals.

9. The system according to claim 8, wherein the amplifier is an operational transconductance amplifier.

10. The system according to claim 8, wherein the analog-driven level shifter operates at supply voltages between a lower voltage of 4 volts and an upper voltage of greater than or equal to 12 volts.

11. The system according to claim 8, wherein the analog-driven level shifter includes an operational amplifier having a built in offset and configured as a voltage follower, the operational amplifier receiving the input signal and outputting a virtual ground for the pair of complementary clock signals that are level shifted.

12. The system according to claim 11, wherein the analog-driven level shifter comprises a stack of diode-connected transistors connected between a positive supply voltage of the analog-driven level shifter and an output of the operational amplifier to set an amplitude of the pair of complementary clock signals that are level shifted, the amplitude above the virtual ground.

13. The system according to claim 11, wherein the analog-driven level shifter comprises capacitors that capacitively couple the pair of complementary clock signals that are not level shifted to the output of the operational amplifier to produce the pair of complementary clock signals that are level shifted.

14. The system according to claim 8, further comprising:
a first symmetrical RC notch filter and a second symmetrical RC notch filter, wherein the first symmetrical RC notch filter is configured to receive a differential signal from the second chopper circuit and the second symmetrical RC notch filter is configured to received a differential signal from the first symmetrical RC notch filter.

15. The system according to claim 14, wherein the first symmetrical RC notch filter has a cutoff frequency at a third harmonic of the chopping frequency or at a fifth harmonic of the chopping frequency and the second symmetrical RC notch filter that has a cutoff frequency at a first harmonic of the chopping frequency.

16. A method for amplifying a signal, the method comprising:
receiving a differential input signal that has a common-mode voltage level that is greater than a pair of complementary clock signals;
level-shifting, using an analog-driven level shifter, the pair of complementary clock signals according to the voltage level of the differential input signal;
chopping the differential input signal by switching its polarity using at least one switching device of a first chopping circuit that are controlled by the level shifted pair of complementary clock signals;
amplifying the chopped differential input signal; and
chopping the amplified chopped differential input signal by switching its polarity using at least one switching device of a second chopping circuit that are controlled by a pair of complementary clock signals with no level shift.

17. The method according to claim 16, wherein the analog-driven level shifter includes an operational amplifier having a built in offset and configured as a voltage follower, the operational amplifier receiving the differential input signal and outputting a virtual ground for the pair of complementary clock signals that are level shifted.

18. The method according to claim 17, wherein the analog-driven level shifter comprises a stack of diode-connected transistors connected between a positive supply voltage of the analog-driven level shifter and an output of the operational amplifier to set an amplitude of the pair of complementary clock signals that are level shifted, the amplitude above the virtual ground.

19. The method according to claim 18, wherein the analog-driven level shifter comprises capacitors that capacitively couple the pair of complementary clock signals that are not level shifted to the output of the operational amplifier to produce the pair of complementary clock signals that are level shifted.

20. The method according to claim 16, further comprising:
filtering the output of the second chopping circuit using a first symmetrical RC filter and a second symmetrical RC filter, wherein the first symmetrical RC filter has a cutoff frequency at a third harmonic of the chopping frequency or at a fifth harmonic of the chopping frequency and the second symmetrical RC notch filter that has a cutoff frequency at a first harmonic of the chopping frequency.

* * * * *